(12) United States Patent
Whitmore et al.

(10) Patent No.: US 8,941,550 B2
(45) Date of Patent: Jan. 27, 2015

(54) MOBILE WIRELESS COMMUNICATIONS DEVICE INCLUDING A SLOT ANTENNA AND RELATED METHODS

(75) Inventors: John Alfred Whitmore, Heidelberg (CA); Ying Tong Man, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 566 days.

(21) Appl. No.: 13/229,231

(22) Filed: Sep. 9, 2011

(65) Prior Publication Data

US 2013/0063314 A1    Mar. 14, 2013

(51) Int. Cl.
| | | |
|---|---|---|
| *H01Q 13/10* | (2006.01) | |
| *H01Q 1/24* | (2006.01) | |
| *H05K 1/02* | (2006.01) | |

(52) U.S. Cl.
CPC .............. *H05K 1/0243* (2013.01); *H01Q 1/242* (2013.01); *H01Q 13/10* (2013.01); *H05K 2201/10371* (2013.01)
USPC .............................. 343/767; 343/702; 343/850

(58) Field of Classification Search
None
See application file for complete search history.

(56) References Cited

U.S. PATENT DOCUMENTS

| | | | | |
|---|---|---|---|---|
| 6,384,793 | B2 | 5/2002 | Scordilis .................. | 343/767 |
| 6,900,771 | B1 | 5/2005 | Huang ..................... | 343/767 |
| 7,443,693 | B2 | 10/2008 | Arnold et al. .............. | 361/800 |
| 7,724,204 | B2 | 5/2010 | Annamaa et al. ....... | 343/700 MS |
| 2004/0032371 | A1 | 2/2004 | Mendolia et al. | |
| 2004/0137971 | A1* | 7/2004 | Shoji ...................... | 455/575.5 |
| 2005/0168389 | A1* | 8/2005 | Yuanzhu et al. .......... | 343/767 |
| 2006/0077113 | A1* | 4/2006 | Yuanzhu ................. | 343/770 |
| 2009/0231215 | A1 | 9/2009 | Taura | |
| 2010/0073247 | A1* | 3/2010 | Arkko et al. ............. | 343/745 |
| 2010/0103058 | A1* | 4/2010 | Kato et al. ............... | 343/702 |
| 2011/0241948 | A1* | 10/2011 | Bevelacqua et al. ..... | 343/702 |
| 2012/0127674 | A1* | 5/2012 | Kinsley .................. | 361/747 |
| 2013/0187818 | A1* | 7/2013 | Desclos et al. ........... | 343/770 |

FOREIGN PATENT DOCUMENTS

| | | |
|---|---|---|
| EP | 1418642 | 5/2004 |
| EP | 1555722 | 7/2005 |
| WO | 0131740 | 5/2001 |

* cited by examiner

*Primary Examiner* — Trinh Dinh
(74) *Attorney, Agent, or Firm* — Allen, Dyer, Doppelt, Milbrath & Gilchrist, P.A.

(57) ABSTRACT

A mobile wireless communications device may include a portable housing and a printed circuit board (PCB) carried by the portable housing. The mobile wireless communications device may also include at least one electronic component carried by the PCB and an electrically conductive enclosure coupled to the PCB and having a top spaced above the PCB over the at least one electronic component. The top of the electrically conductive enclosure may have a slot therein defining a slot antenna.

17 Claims, 11 Drawing Sheets

MOBILE WIRELESS COMMUNICATIONS DEVICE INCLUDING A SLOT ANTENNA AND RELATED METHODS

TECHNICAL FIELD

The present disclosure generally relates to the field of wireless communications systems, and, more particularly, to mobile wireless communications devices and related methods.

BACKGROUND OF THE INVENTION

Mobile wireless communications systems continue to grow in popularity and have become an integral part of both personal and business communications. For example, cellular telephones allow users to place and receive voice calls almost anywhere they travel. Moreover, as cellular telephone technology has increased, so too has the functionality of cellular devices and the different types of devices available to users. For example, many cellular devices now incorporate personal digital assistant (PDA) features such as calendars, address books, task lists, etc. Moreover, such multi-function devices may also allow users to wirelessly send and receive electronic mail (email) messages and access the Internet via a cellular network and/or a wireless local area network (WLAN), for example.

Even so, as the functionality of cellular communications devices continues to increase, so too does the demand for smaller devices which are easier and more convenient for users to carry. One challenge this poses for cellular device manufacturers is designing housings that cooperate with antennas to provide desired operating characteristics within the relatively limited amount of space available.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements or steps in alternative embodiments.

In accordance with one exemplary aspect, a mobile wireless communications device may include a portable housing and a printed circuit board (PCB) carried by the portable housing. The mobile wireless communications device may also include at least one electronic component carried by the PCB and an electrically conductive enclosure coupled to the PCB and having a top spaced above the PCB over the at least one electronic component. The top of the electrically conductive enclosure may have a slot therein defining a slot antenna.

The mobile wireless communications device may further include a tuning element carried by the electrically conductive enclosure and being positioned over the slot, for example. The tuning element may include a dielectric material body. The tuning element may further include a conductive material layer on the dielectric material body, for example.

The slot may include a base slot, and first and second parallel slots extending in opposite directions from the base slot. The base slot may have opposing ends, and the first and second parallel slots may extend from the opposing ends, for example.

The electrically conductive enclosure may further include a sidewall depending from the top, for example. The mobile wireless communications device may further include at least one antenna feed carried by the PCB and coupled to the electrically conductive enclosure adjacent the slot. The at least one antenna feed may include a pair of antenna feeds coupled to the electrically conductive enclosure on opposing sides of the slot, for example. The at least one antenna feed may include at least one of a flexible stripline and a spring contact.

The mobile wireless communications device of may further include a conductive layer carried by the PCB defining a ground plane, for example. The electrically conductive enclosure is carried above the ground plane.

A method aspect is directed to a method of making a mobile wireless communications device that may include a portable housing, a printed circuit board (PCB) carried by the portable housing, and at least one electronic component carried by the PCB. The method may include forming a slot in a top of an electrically conductive enclosure to be coupled to the PCB to form a slot antenna. The top may be spaced above the PCB over the at least one electronic component.

Figure 1:
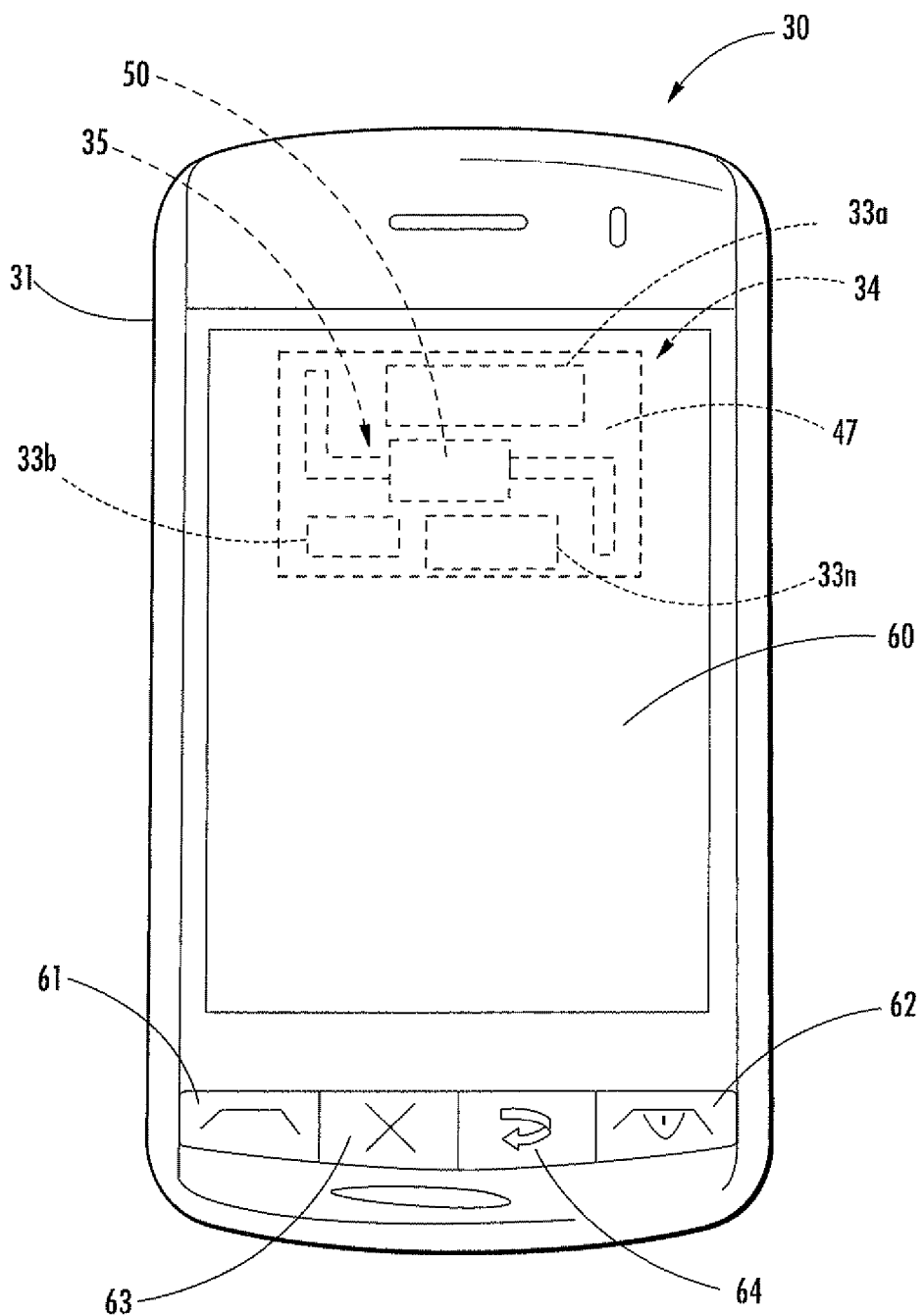
FIG. 1 is a top plan view of a mobile wireless communications device including an electrically conductive enclosure having a slot therein defining a slot antenna in accordance with one example embodiment.
Figure 2:
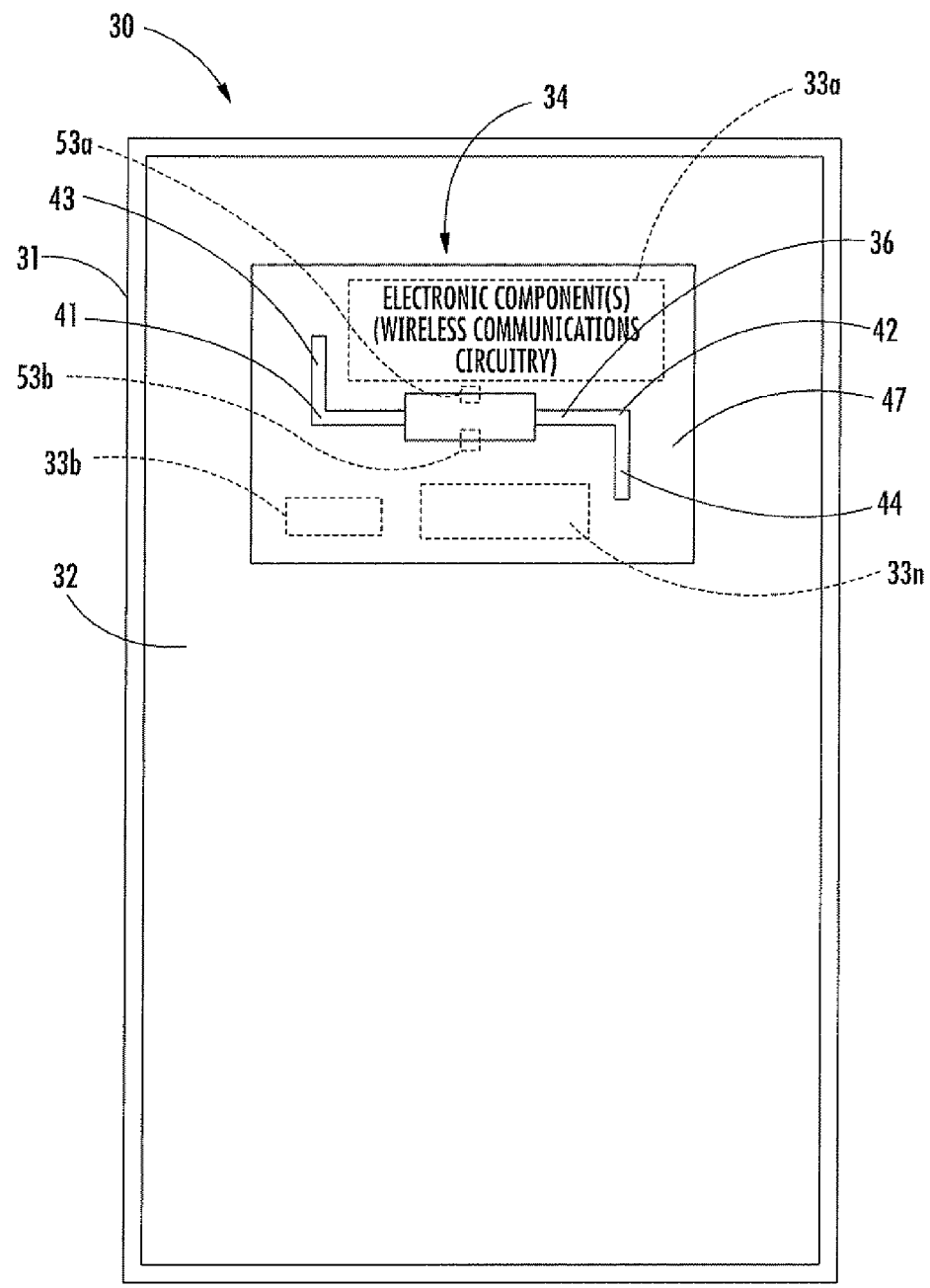
FIG. 2 is a schematic block diagram of a portion of the device of FIG. 1.
Figure 3:
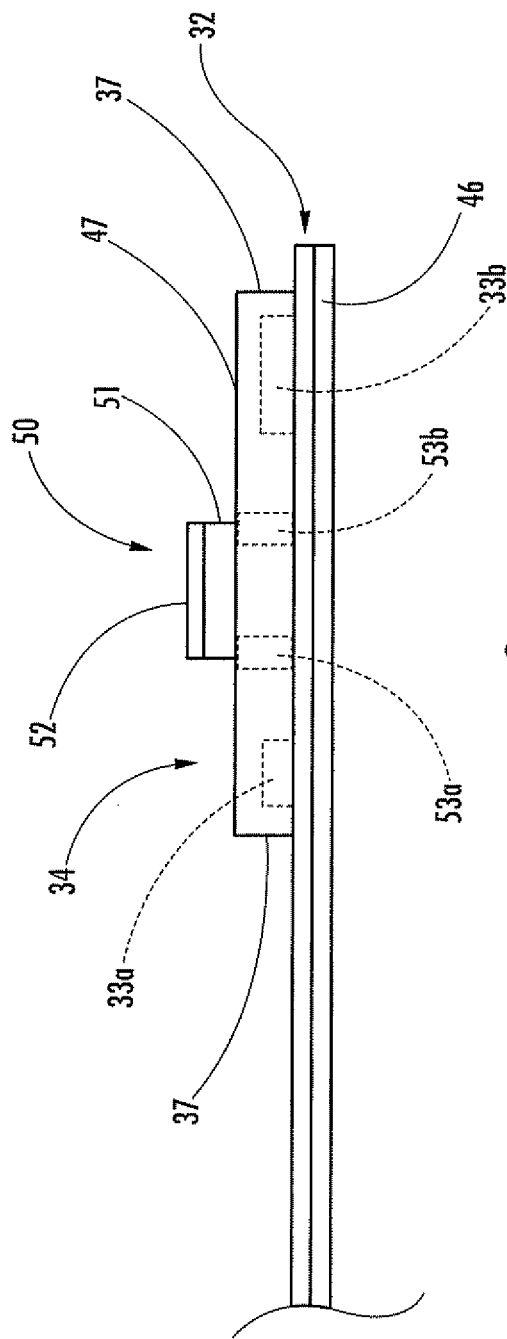
FIG. 3 is a side schematic view of the portion of the device in FIG. 2.

Referring initially to FIGS. 1-3, a mobile wireless communications device 30 illustratively includes a portable housing 31 a printed circuit board (PCB) 32, carried by the portable housing. The PCB 32 also includes a conductive layer 46 defining a ground plane (FIG. 3).

The exemplary device 30 further illustratively includes a display 60 and a plurality of control keys including an "off hook" (i.e., initiate phone call) key 61, an "on hook" (i.e., discontinue phone call) key 62, a menu key 63, and a return or escape key 64. Operation of the various device components and input keys, etc., will be described further below with reference to FIG. 11.

The wireless communications device 30 also includes electronic components 33a-33n carried by PCB 32. The electronic components 33a-33n may include wireless communications circuitry configured to perform a wireless communications function, for example, wireless voice or data communications. Other circuitry, for example, discrete components, associated with the mobile wireless communications device 30 may also be carried by the PCB 32.

An electrically conductive enclosure 34 is coupled to the PCB 32 and carried above the ground plane 46. The electrically conductive enclosure 34 includes a top 47 spaced above PCB 32 over the electronic components 33a-33n. The electrically conductive enclosure 34 also includes a sidewall 37 depending from the top 47.

The top 47 of the electrically conductive enclosure 34 has a slot 35 therein defining a slot antenna. The slot 35 illustratively includes a base slot 36 having opposing ends 41, 42. First and second parallel slots 43, 44 extend in opposite directions from the opposing ends 41, 42 of the base slot 36. The slot 35 may extend in other directions, but it may be desirable that the slot does not "double over" on itself as this may reduce antenna efficiency and thus performance. The electrically conductive enclosure 34 may have additional slots or openings for ventilation, which may be relatively small compared to the slot 35. Moreover, the electrically conductive enclosure 34 may have more than one slot therein defining more than one slot antenna.

The length of the slot 35 determines the operating frequency of the slot antenna. The position of the electrically conductive enclosure 34 with respect to the ground plane 46 is another variable that may affect performance of the slot antenna.

For the slot antenna to operate in the correct mode for the frequency of operation and to give the desired bandwidth, it is desirable that the slot 35 be the correct length, the electrically conductive enclosure 34 surrounding the slot 35 is large enough to support circulating currents around the slot, and the cavity, i.e. the distance of the slot and the electrically conductive enclosure 34 above the PCB 32, has sufficient depth. Physical restraints of the mechanics of the mobile wireless communications device 30 may hamper obtaining of desired characteristics.

To compensate for the increased difficulty of obtaining desired characteristics because of the physical constraints, i.e. size, the mobile wireless communications device 30 includes a tuning element 50 carried by the electrically conductive enclosure 34. The tuning member 50 loads the slot 35 as a parasitic element. The tuning element 50 is illustratively positioned over the slot 35, and more particularly, bridges or spans the slot 35. The tuning member 50 includes a dielectric material body 51 and may have a relatively high dielectric constant, for example. For example, the dielectric material body 51 may be FR-4 dielectric material or a ceramic material. Of course, the dielectric material body 51 may include other dielectric materials.

The tuning element 50 may also optionally include a conductive material layer 52 on the dielectric material body 51. The conductive material layer 52 may be copper, for example. The conductive material layer 52 may be another conductive material, as will be appreciated by those skilled in the art. More than one tuning element may be used, as will be appreciated by those skilled in the art.

The thickness of the tuning element 50 may be particularly useful for determining gain and return loss of the slot antenna. The height of the slot 35 and the tuning element 50 above the PCB 32 also determines the gain or return loss. The thickness of the tuning element 50 and the height of the tuning element and the slot 35 above the PCB may be the primary adjustments for determining gain or return loss. The position of the electrically conductive enclosure 34 in the X-Y plane on the ground plane 46, and the X-Y position of the tuning element 50 may also determine the gain or return loss of the slot antenna. As will be appreciated by those skilled in the art, the height of the tuning element 50 and the electrically conductive enclosure 34 may be adjustable via an adjustment mechanism. This may accommodate in-situ adjustment and thus, different gain patterns, for example.

The slot antenna may be particularly useful for operating in the IEEE 802.11a frequency band of approximately 5.2 GHz to 5.8 GHz. As will be appreciated by those skilled in the art, mounting a slot antenna on the electrically conductive enclosure 34 advantageously helps ease the problem of finding the room or space within the portable housing 31. As the IEEE 802.11a standard describes a single band antenna, moving it away from a clear area onto the PCB, for example, may be particularly useful as it would leave more room for multi-band antennas, which are typically more difficult to implement.

A pair of antenna feeds in the form of spring contacts 53a, 53b are carried by the PCB 32 and coupled to the electrically conductive enclosure 34 adjacent the slot 35, and more particularly, on opposing sides of the slot.

The location where the pair of spring contacts 53a, 53b coupled to the electrically conductive enclosure 34 adjacent the slot 35 determines multiple resonances, as will be appreciated by those skilled in the art. In particular, one resonance may be obtained by coupling the pair of spring contacts 53a, 53b adjacent the center of the slot 35 with respect to its length. If the pair of spring contacts 53a, 53b are coupled off-center of the slot with respect to its length, multiple resonance may be obtained.

Figure 4:
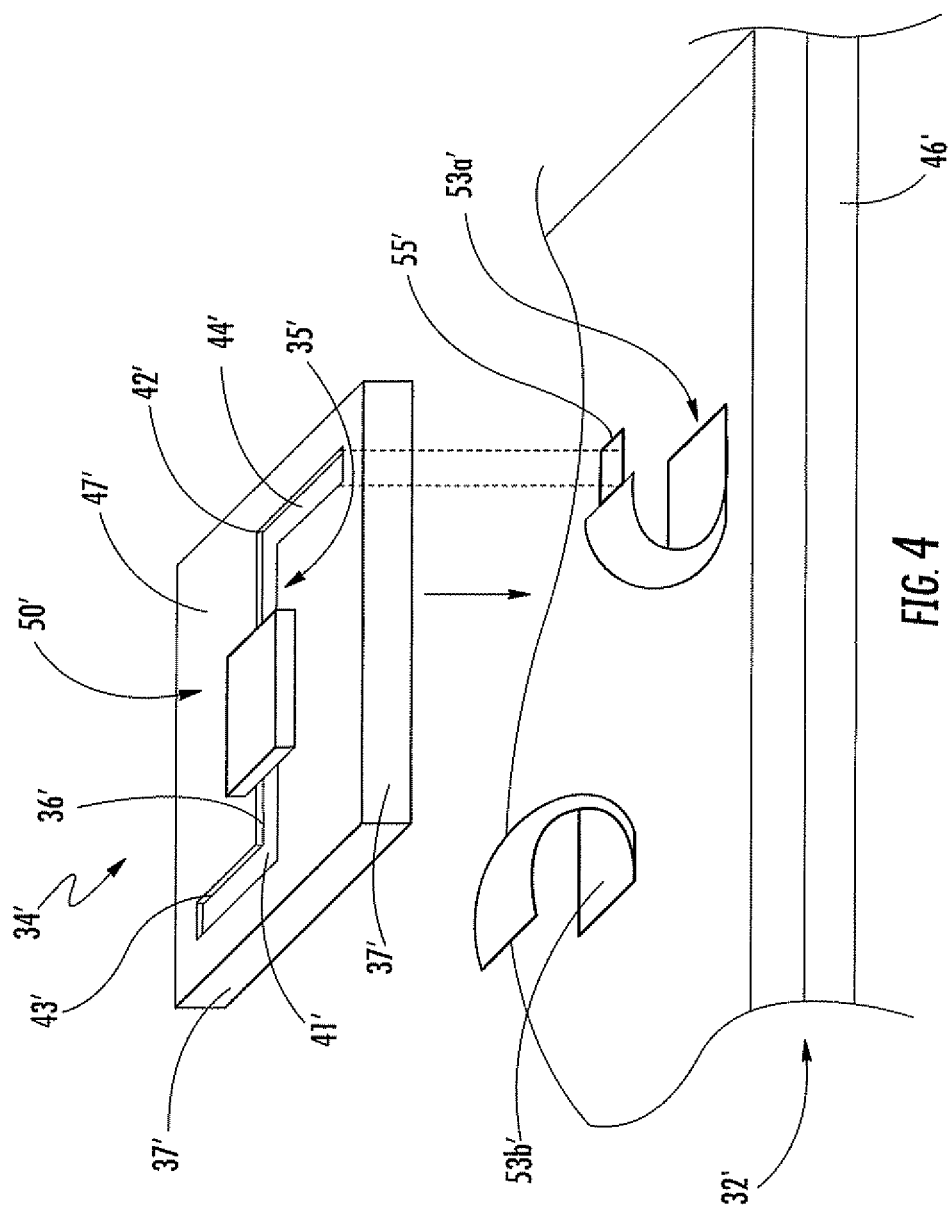
FIG. 4 is a perspective view of a portion of a device including an antenna feed in accordance with another example embodiment.

Referring now to FIG. 4 in another example embodiment, the antenna feeds are in the form of flexible striplines 53a', 53b'. The flexible striplines 53a', 53b' are illustratively bent over in a c-shape. An outer portion of one of the flexible striplines 53a' is trimmed back to expose a center portion 55'. The center portion 55' couples to the electrically conductive enclosure 34' adjacent the slot 35' and crosses over the slot. The second flexible stripline 53b', couples to the ground plane 46'. In one embodiment, the second flexible stripline 53b' is 53 mm away from the first flexible stripline 53a'. The second flexible stripline 53b' does not cross the slot 35', but rather couples to the electrically conductive enclosure 34'. The pair of antenna feeds 53a', 53b' may be another type of feed, for example, pogo pins, or other mechanical structure and may be coupled in another arrangement, as will be appreciated by those skilled in the art.

Figure 5:
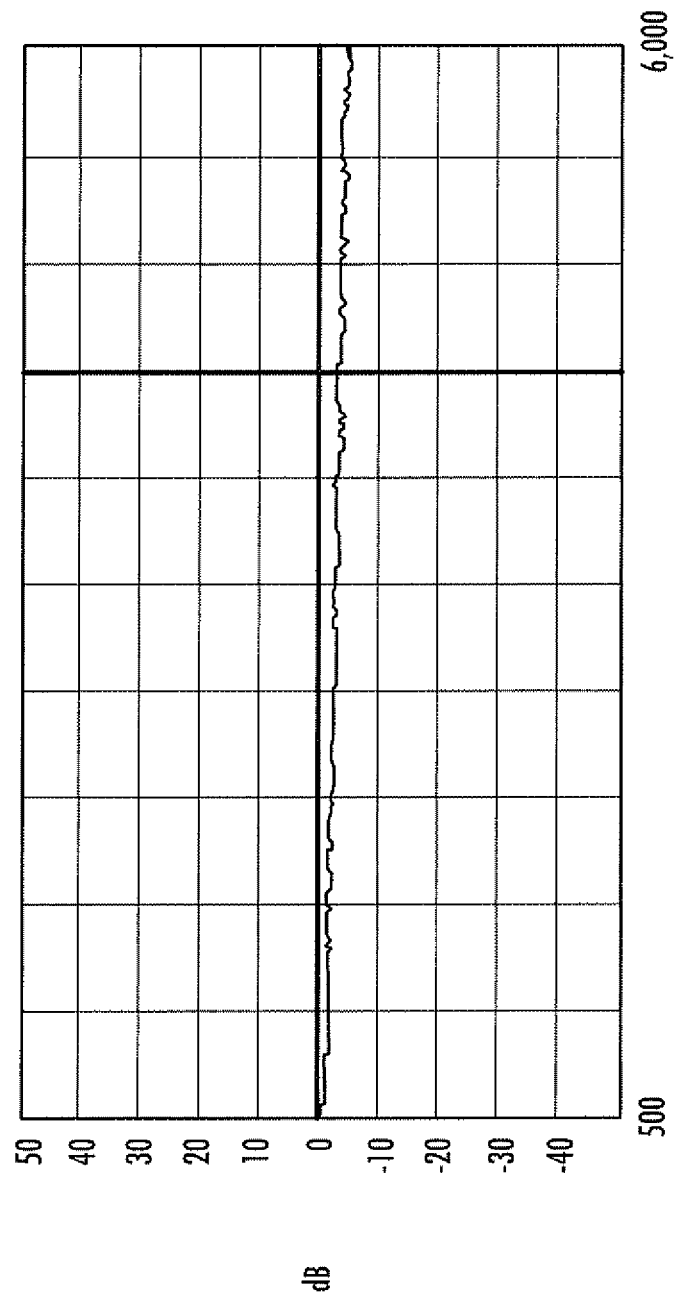
FIG. 5 is a graph of measured return loss for a prototype mobile wireless communications device without a tuning element.
Figure 6:
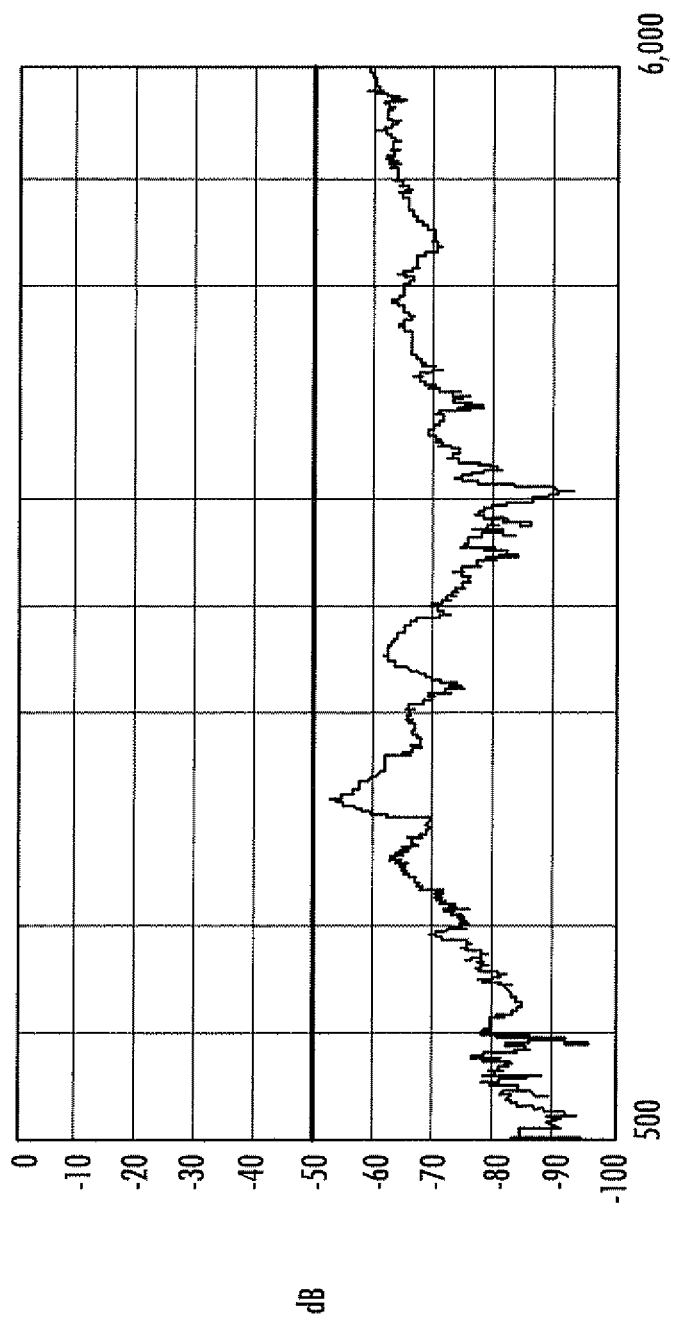
FIG. 6 is a graph of measured gain for the prototype mobile wireless communications device without a tuning element.
Figure 7:
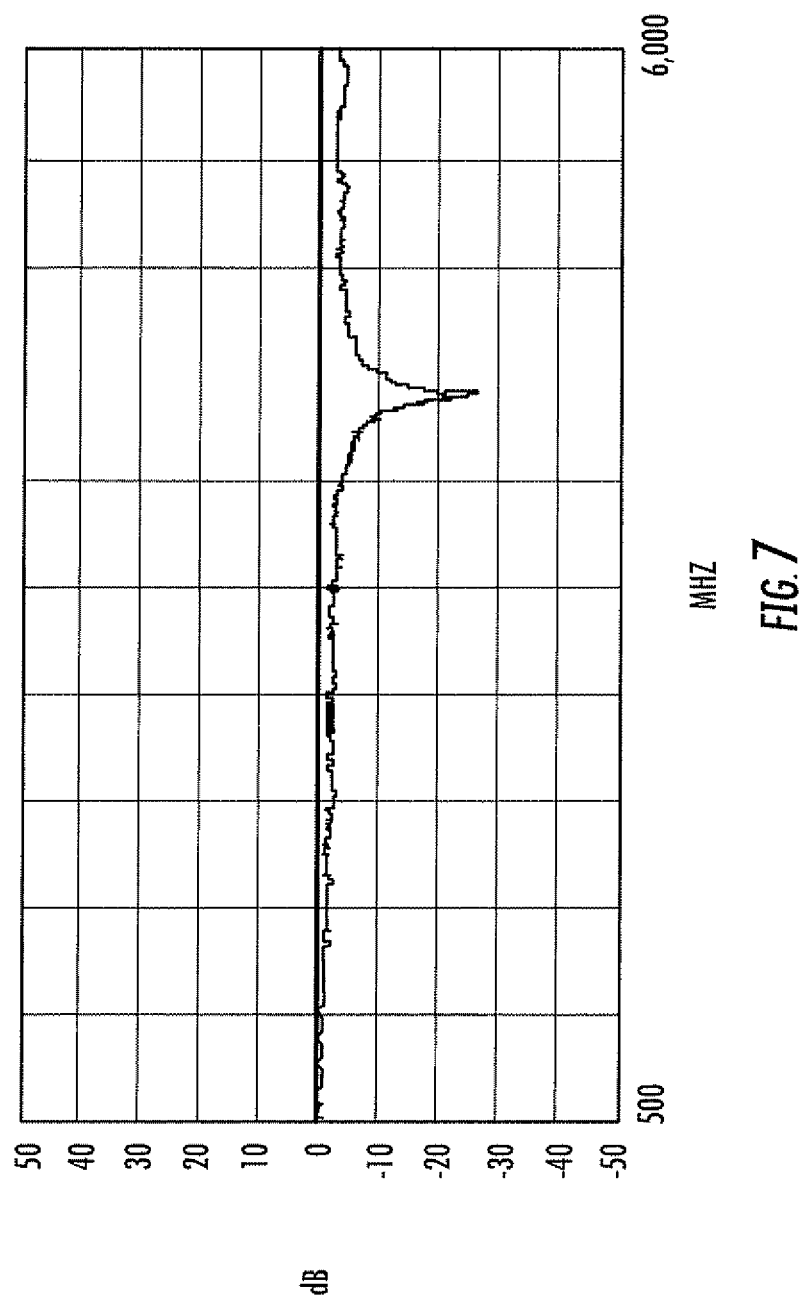
FIG. 7 is a graph of measured return loss for a prototype mobile wireless communications device with a FR-4 tuning element.
Figure 8:
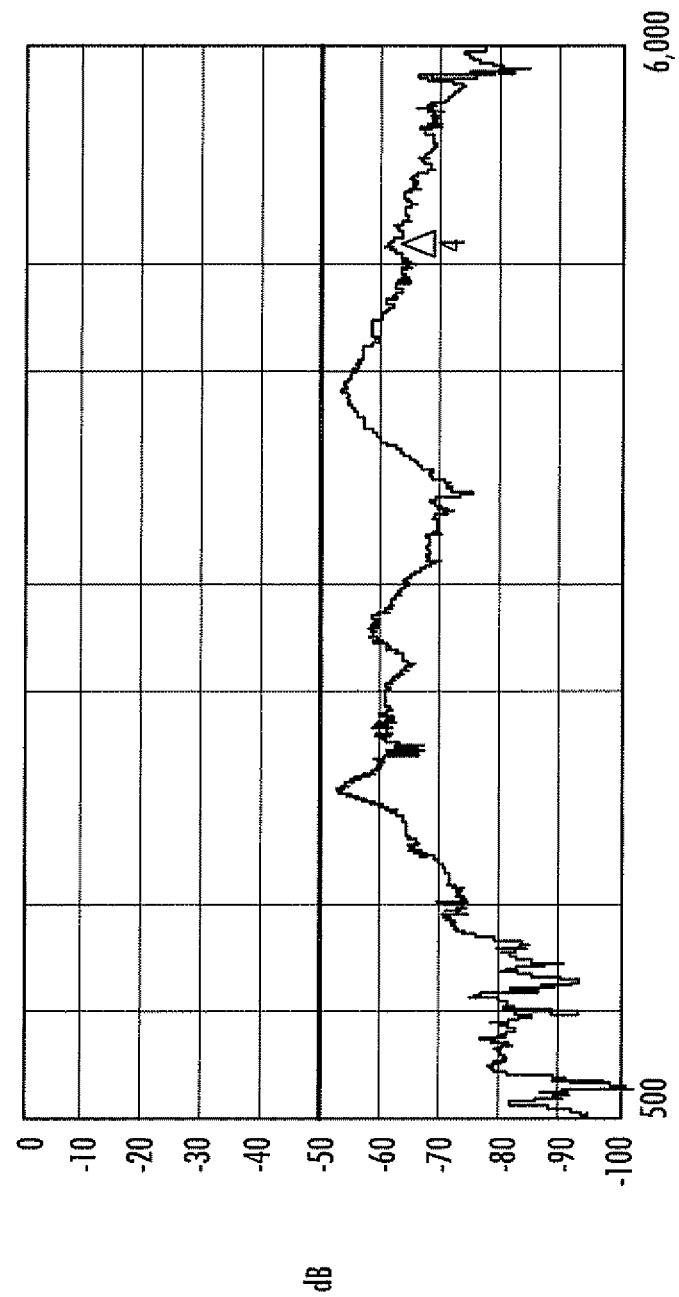
FIG. 8 is a graph of measured gain for the prototype mobile wireless communications device with the FR-4 tuning element.

Referring now to the graphs in FIGS. 5-6, a measured return loss graph and an antenna gain graph for a prototype mobile wireless communications device similar to that described above with respect to FIG. 1, but without a tuning element are respectively illustrated. Referring now the graphs in FIGS. 7-8, a measured return loss graph and antenna gain graph for the prototype mobile wireless communications device including a tuning element are respectively illustrated. The tuning element was a FR-4 dielectric material strip that measured 9 mm×3 mm by 4 mm and was positioned in the center of the slot with respect to it length and width. A layer of copper was carried by the FR-4.

Figure 9:
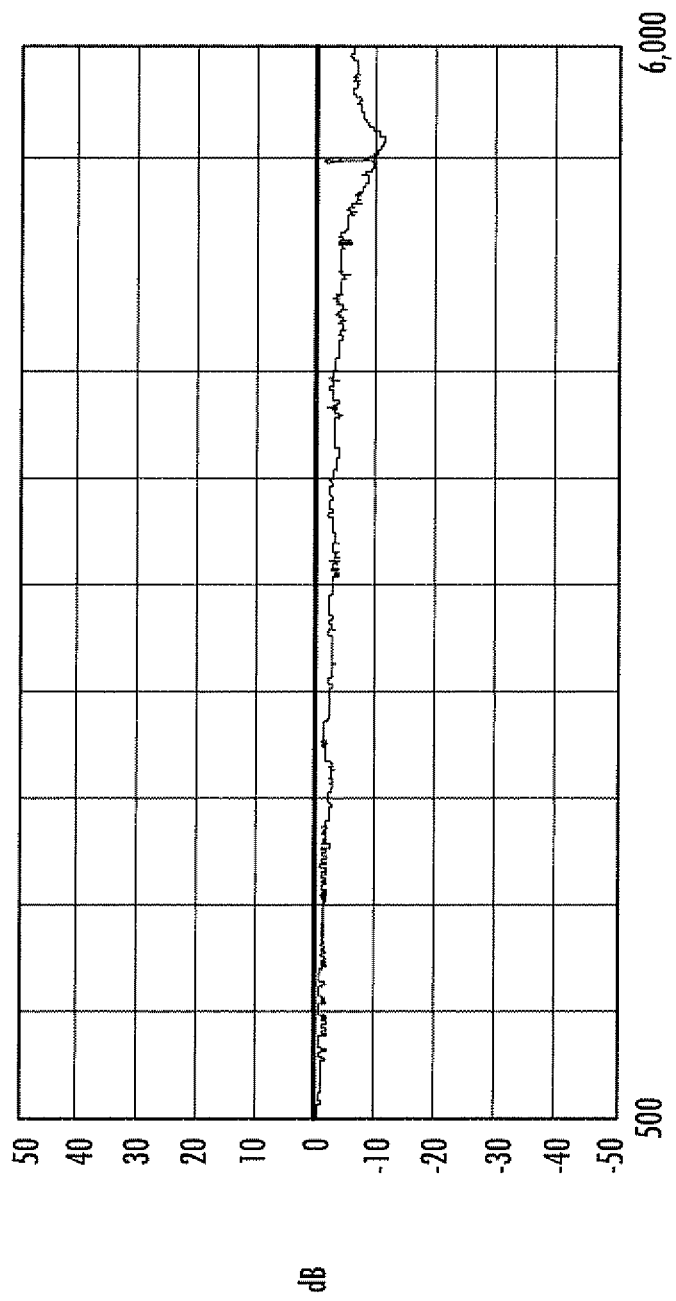
FIG. 9 is a graph of measured return loss for a prototype mobile wireless communications device with a TDK ceramic tuning element.
Figure 10:
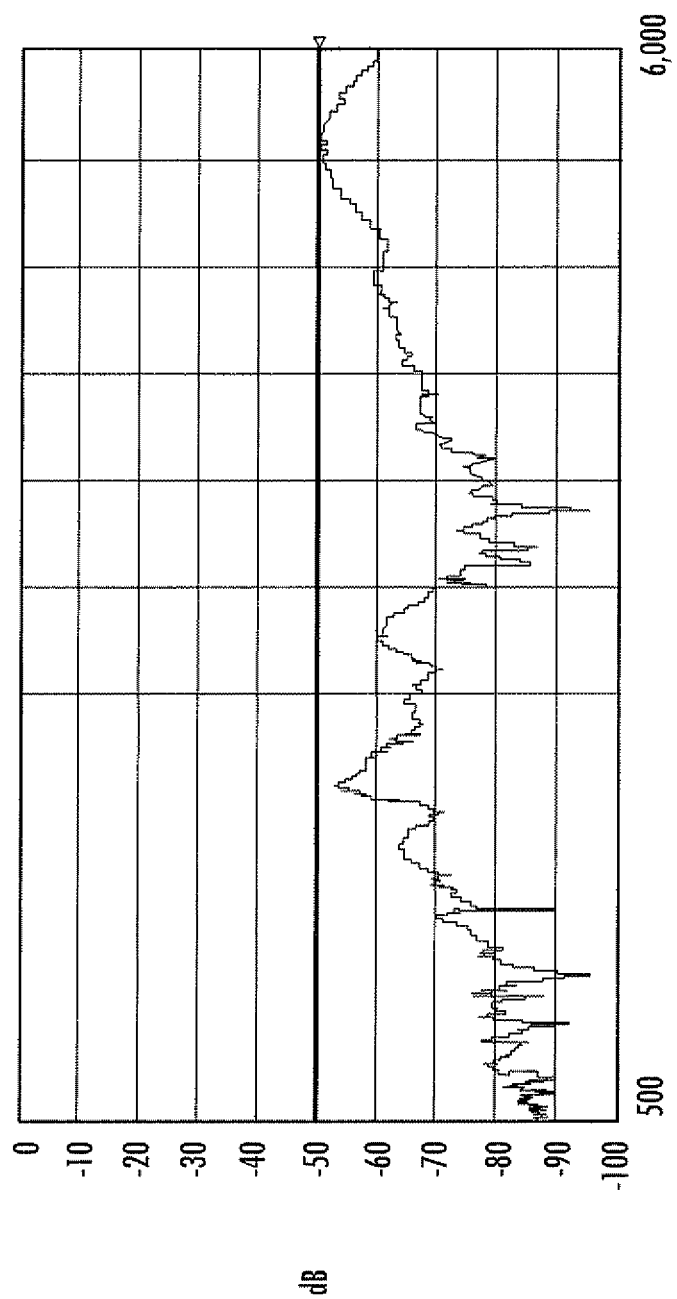
FIG. 10 is a graph of measured gain for the prototype mobile wireless communications device with the TDK ceramic tuning element.

Referring now the graphs in FIGS. 9-10, a measured return loss graph and antenna gain graph for the prototype mobile wireless communications device including a tuning element are respectively illustrated. The tuning element was a TDK ceramic dielectric material that measured 30 mm×8 mm by 1 mm and was positioned equally over the slot with respect to it length and width. The TDK ceramic dielectric material had a dielectric constant of 6.2.

A method aspect is directed to a method of making a mobile wireless communications device 30 that includes a portable housing 31, a printed circuit board 32 (PCB) carried by the portable housing, and electronic components 33a-33n carried by the PCB. The method also includes forming a slot 35 in a top 47 of an electrically conductive enclosure 34 to be coupled to the PCB 32 to form a slot antenna. The top 47 is to be spaced above the PCB 32 over the electronic components 33a-33n.

Example components of a mobile wireless communications device 1000 that may be used in accordance with the above-described embodiments are further described below with reference to FIG. 11. The device 1000 illustratively includes a housing 1200, a keyboard or keypad 1400 and an output device 1600. The output device shown is a display 1600, which may comprise a full graphic LCD. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400.

The housing 1200 may be elongated vertically, or may take on other sizes and shapes (including clamshell housing structures). The keypad may include a mode selection key, or other hardware or software for switching between text entry and telephony entry.

Figure 11:
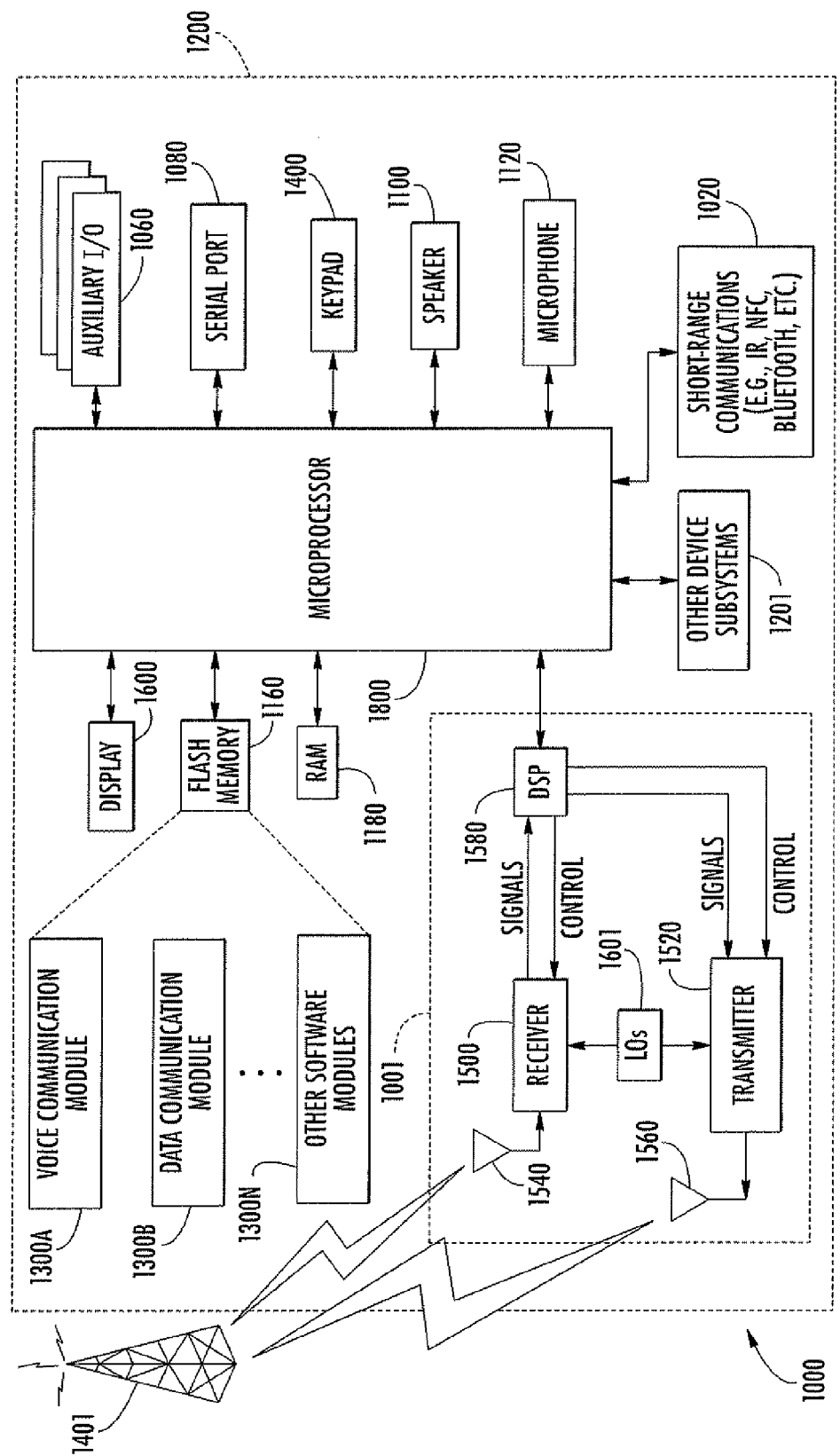
FIG. 11 is a schematic block diagram illustrating additional components that may be included in the mobile wireless communications device of FIG. 1.

In addition to the processing device 1800, other parts of the mobile device 1000 are shown schematically in FIG. 11. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having data and, optionally, voice communications capabilities. In addition, the mobile device 1000 may have the capability to communicate with other computer systems via the Internet.

Operating system software executed by the processing device 1800 is stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 13003, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the MobitexTH, Data TACT or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as 3GSM, 3GPP, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore typically involves use of a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device may also be used to compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, a Bluetooth™ communications module to provide for communication with similarly-enabled systems and devices, or a near field communications (NFC) sensor for communicating with a NFC device or NFC tag via NFC communications.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A mobile wireless communications device comprising:
    a portable housing;
    a printed circuit board (PCB) carried by said portable housing;
    at least one electronic component carried by said PCB; an electrically conductive enclosure coupled to said PCB and having a top spaced above said PCB over said at least one electronic component;
    the top of said electrically conductive enclosure having a slot therein defining a slot antenna; and
    a tuning element carried by said electrically conductive enclosure and being positioned over the slot, wherein said tuning element comprises a dielectric material body.

2. The mobile wireless communications device of claim 1, wherein said tuning element further comprises a conductive material layer on said dielectric material body.

3. The mobile wireless communications device of claim 1, wherein the slot comprises a base slot, and first and second parallel slots extending in opposite directions from the base slot.

4. The mobile wireless communications device of claim 3, wherein the base slot has opposing ends; and wherein the first and second parallel slots extend from the opposing ends.

5. The mobile wireless communications device of claim 1, further comprising at least one antenna feed carried by said PCB and coupled to said electrically conductive enclosure adjacent the slot.

6. The mobile wireless communications device of claim 5, wherein said at least one antenna feed comprises a pair of antenna feeds coupled to said electrically conductive enclosure on opposing sides of the slot.

7. The mobile wireless communications device of claim 5, wherein said at least one antenna feed comprises at least one of a flexible stripline and a spring contact.

8. The mobile wireless communications device of claim 1, further comprising a conductive layer carried by said PCB defining a ground plane; and wherein said electrically conductive enclosure is carried above said ground plane.

9. A mobile wireless communications device comprising:
    a portable housing:
    a printed circuit board (PCB) carried by said portable housing;
    at least one electronic component carried by said PCB;
    an electrically conductive enclosure coupled to said PCB and having a top spaced above said PCB over said sidewall at least one electronic component and a sidewall depending from the top, the top of said electrically conductive enclosure having a slot therein defining a slot antenna; and
    a tuning element carried by said electrically conductive enclosure and being positioned over the slot, wherein said tuning element comprises a dielectric material body.

10. The mobile wireless communications device of claim 9, wherein said tuning element further comprises a conductive material layer on said conductive body.

11. The mobile wireless communications device of claim 9, wherein the slot comprises a base slot, and first and second parallel slots extending in opposite directions from the base slot.

12. The mobile wireless communications device of claim 9, wherein the base slot has opposing ends; and
    wherein the first and second parallel slots extend from the opposing ends.

13. The mobile wireless communications device of claim 9, further comprising at least one antenna feed carried by said PCB and coupled to said electrically conductive enclosure adjacent the slot.

14. A method of making a mobile wireless communications device comprising a portable housing, a printed circuit board (PCB) carried by the portable housing, and at least one electronic component carried by the PCB, the method comprising:
    forming a slot in a top of an electrically conductive enclosure to be coupled to the PCB to form a slot antenna, the top to be spaced above the PCB over the at least one electronic component; and
    positioning a tuning element over the slot and carried by the electrically conductive enclosure, wherein the tuning element comprises a dielectric material body.

15. The method of claim 14, wherein the tuning element further comprises a conductive material layer on the dielectric material body.

16. The method of claim 14, wherein forming the slot comprises forming a base slot, and forming first and second parallel slots extending in opposite directions from the base slot.

17. The method of claim 16, wherein the base slot has opposing ends; and wherein the first and second parallel slots extend from the opposing ends.

* * * * *